(12) United States Patent
Koyanagi (10) Patent No.: US 7,590,675 B2
(45) Date of Patent: Sep. 15, 2009

(54) DIGITAL FILTER, DESIGN METHOD THEREOF, DESIGN DEVICE, AND DIGITAL FILTER DESIGN PROGRAM

(75) Inventor: Yukio Koyanagi, Saitama (JP)

(73) Assignee: NSC Co., Ltd., Tokyo (JP)

( * ) Notice: Subject to any disclaimer, the term of this patent is extended or adjusted under 35 U.S.C. 154(b) by 679 days.

(21) Appl. No.: 10/556,775

(22) PCT Filed: Mar. 18, 2004

(86) PCT No.: PCT/JP2004/003668

§ 371 (c)(1),
(2), (4) Date: Nov. 15, 2005

(87) PCT Pub. No.: WO2004/102800

PCT Pub. Date: Nov. 25, 2004

(65) Prior Publication Data

US 2006/0208831 A1    Sep. 21, 2006

(30) Foreign Application Priority Data

May 15, 2003  (JP)  ............................. 2003-137134

(51) Int. Cl.
*G06F 17/10* (2006.01)
(52) U.S. Cl. .................................... 708/319
(58) Field of Classification Search ................ 708/319
See application file for complete search history.

(56) References Cited

U.S. PATENT DOCUMENTS

| 6,678,708 | B1 * | 1/2004 | Acharya ..................... 708/308 |
| 6,993,464 | B2 * | 1/2006 | Chiu et al. ..................... 703/2 |
| 7,251,271 | B1 * | 7/2007 | Eriksson ..................... 375/229 |
| 2007/0053420 | A1 * | 3/2007 | Koyanagi ..................... 375/232 |
| 2007/0208793 | A1 * | 9/2007 | Koyanagi ..................... 708/300 |

FOREIGN PATENT DOCUMENTS

| JP | 2002-368584 | 12/2002 |
| WO | WO-03-023960 | 3/2003 |
| WO | WO-2004-102800 | 11/2004 |

* cited by examiner

*Primary Examiner*—David H Malzahn
(74) *Attorney, Agent, or Firm*—Connolly Bove Lodge & Hutz LLP (57) ABSTRACT

An original filter is connected to an adjustment filter in the longitudinal way. The original filter has a first filter coefficient of a symmetric numeric string. The adjustment filter has a contact point at a position where the maximum value is acquired in the original filter frequency amplitude characteristic A and has a symmetric second filter coefficient realizing the frequency amplitude characteristic B having the minimum value at the contact point. By executing a convolution calculation of the first filter coefficient and the second filter coefficient, it is possible to design a desired filter coefficient.

19 Claims, 9 Drawing Sheets

| FIRST FILTER COEFFICIENT | SECOND FILTER COEFFICIENT | THIRD FILTER COEFFICIENT RESULTING FROM CASCADE CONNECTION |
|---|---|---|
| 0 | | |
| 0 | | |
| 0 | | |
| 0 | | |
| $H_m$ | $-kH_m$ | $H_m \times (-kH_m)$ |
| $H_{m-1}$ | $-kH_{m-1}$ | $H_m \times (-kH_m) + H_{m-1} \times (-kH_{m-1})$ |
| ⋮ | ⋮ | ⋮ |
| $H_0$ | $-kH_0+(1+k)$ | |
| ⋮ | ⋮ | |
| $H_{-(m-1)}$ | $-kH_{-(m-1)}$ | |
| $H_{-m}$ | $-kH_{-m}$ | |
| 0 | | $H_{-m} \times (-kH_{-m}) + H_{-(m-1)} \times (kH_{-(m-1)})$ |
| 0 | | $H_{-m} \times (-kH_{-m})$ |
| ⋮ | | |
| 0 | | |

| | L4a1 | L4a2 | L4a3 | L4a4 | L4a5 | L4a6 | L4a7 | L4a8 |
|---|---|---|---|---|---|---|---|---|
| -1 | -1 | -1 | -1 | -1 | -1 | -1 | -1 | -1 |
| 4 | 3 | 2 | 1 | 0 | -1 | -2 | -3 | -4 |
| -1 | 3 | 6 | 8 | 9 | 9 | 8 | 6 | 3 |
| | -1 | 2 | 8 | 16 | 25 | 34 | 42 | 48 |
| | 0 | -1 | 1 | 9 | 25 | 50 | 84 | 126 |
| | 0 | 0 | -1 | 0 | 9 | 34 | 84 | 168 |
| | 0 | 0 | 0 | -1 | -1 | 8 | 42 | 126 |
| | 0 | 0 | 0 | 0 | -1 | -2 | 6 | 48 |
| | 0 | 0 | 0 | 0 | 0 | -1 | -3 | 3 |
| | 0 | 0 | 0 | 0 | 0 | 0 | -1 | -4 |
| | 0 | 0 | 0 | 0 | 0 | 0 | 0 | -1 |
| | 0 | 0 | 0 | 0 | 0 | 0 | 0 | 0 |

| | H4s1 | H4s2 | H4s3 | H4s4 | H4s5 | H4s6 | H4s7 | H4s8 |
|---|---|---|---|---|---|---|---|---|
| 1 | 1 | 1 | 1 | 1 | 1 | 1 | 1 | 1 |
| 4 | 3 | 2 | 1 | 0 | -1 | -2 | -3 | -4 |
| 1 | -3 | -6 | -8 | -9 | -9 | -8 | -6 | -3 |
| | -1 | 2 | 8 | 16 | 25 | 34 | 42 | 48 |
| | 0 | 1 | -1 | -9 | -25 | -50 | -84 | -126 |
| | 0 | 0 | -1 | 0 | 9 | 34 | 84 | 168 |
| | 0 | 0 | 0 | 1 | 1 | -8 | -42 | -126 |
| | 0 | 0 | 0 | 0 | -1 | -2 | 6 | 48 |
| | 0 | 0 | 0 | 0 | 0 | 1 | 3 | -3 |
| | 0 | 0 | 0 | 0 | 0 | 0 | -1 | -4 |
| | 0 | 0 | 0 | 0 | 0 | 0 | 0 | 1 |
| | 0 | 0 | 0 | 0 | 0 | 0 | 0 | 0 |

FIG. 16

| | B4s1 | B4s2 | B4s3 | B4s4 | B4s5 | B4s6 | B4s7 | B4s8 |
|---|---|---|---|---|---|---|---|---|
| 1 | 1 | 1 | 1 | 1 | 1 | 1 | 1 | 1 |
| 0 | 0 | 0 | 0 | 0 | 0 | 0 | 0 | 0 |
| 4 | 3 | 2 | 1 | 0 | -1 | -2 | -3 | -4 |
| 0 | 0 | 0 | 0 | 0 | 0 | 0 | 0 | 0 |
| 1 | -3 | -6 | -8 | -9 | -9 | -8 | -6 | -3 |
| | 0 | 0 | 0 | 0 | 0 | 0 | 0 | 0 |
| | -1 | 2 | 8 | 16 | 25 | 34 | 42 | 48 |
| | 0 | 0 | 0 | 0 | 0 | 0 | 0 | 0 |
| | 0 | 1 | -1 | -9 | -25 | -50 | -84 | -126 |
| | 0 | 0 | 0 | 0 | 0 | 0 | 0 | 0 |
| | 0 | 0 | -1 | 0 | 9 | 34 | 84 | 168 |
| | 0 | 0 | 0 | 0 | 0 | 0 | 0 | 0 |
| | 0 | 0 | 0 | 1 | 1 | -8 | -42 | -126 |
| | 0 | 0 | 0 | 0 | 0 | 0 | 0 | 0 |
| | 0 | 0 | 0 | 0 | -1 | -2 | 6 | 48 |
| | 0 | 0 | 0 | 0 | 0 | 0 | 0 | 0 |
| | 0 | 0 | 0 | 0 | 0 | 1 | 3 | -3 |
| | 0 | 0 | 0 | 0 | 0 | 0 | 0 | 0 |
| | 0 | 0 | 0 | 0 | 0 | 0 | -1 | -4 |
| | 0 | 0 | 0 | 0 | 0 | 0 | 0 | 0 |
| | 0 | 0 | 0 | 0 | 0 | 0 | 0 | 1 |
| | 0 | 0 | 0 | 0 | 0 | 0 | 0 | 0 |

DIGITAL FILTER, DESIGN METHOD THEREOF, DESIGN DEVICE, AND DIGITAL FILTER DESIGN PROGRAM

This application is a national phase filing based on PCT/JP2004/003668, filed Mar. 18, 2004.

BACKGROUND OF THE INVENTION

1. Field of the Invention

The present invention relates to a digital filter, design method thereof, design device, and digital filter design program, and more particularly, to a design method of FIR filter.

2. Description of the Related Art

An FIR (Finite Impulse Response) filter is one type of digital filter. This FIR filter is a type of filter which is provided with tapped delay lines made up of a plurality of delayers, multiplies output signals of the respective taps several-fold, adds up the multiplication results and outputs the addition result, and has the following advantages. First, since the poles of a transfer function of the FIR filter exists only at the origin of the z-plane, the circuit is always stable. Second, if filter coefficients are symmetric, it is possible to realize a completely accurate rectilinear phase characteristic.

For this FIR filter, an impulse response expressed by a finite time length constitutes filter coefficients as are. Therefore, designing an FIR filter is equal to determining filter coefficients so that a desired frequency characteristic is obtained. Conventionally, an FIR filter is designed using the following method; filter coefficients are calculated based on a target frequency characteristic, the filter coefficients are subjected to windowing and a finite number of coefficient groups are obtained. Then, the coefficient groups obtained are subjected to an FFT (fast Fourier transform) to be transformed to a frequency characteristic and it is checked whether the frequency characteristic satisfies the target characteristic or not.

When filter coefficients are calculated from the target frequency characteristic, for example, a convolution, etc., using a Chebyshev approximation is performed based on a ratio between a sampling frequency and cutoff frequency. The number of coefficients obtained in this way becomes enormous and using all those coefficients will result in an extremely large number of taps and multipliers of the filter circuit, which is unrealistic. For this reason, the number of filter coefficients acquired through a convolution calculation is reduced to a degree that it falls within a range of practicality by means of windowing.

However, the frequency characteristic of the FIR filter obtained using the conventional design method depends on a window function and approximate expression, and therefore unless these are correctly set, it is not possible to obtain a preferable target frequency characteristic. However, it is generally difficult to set the window function or approximate expression appropriately. Furthermore, when windowing is performed to reduce the number of filter coefficients, a discretization error occurs in the frequency characteristic, making it difficult to realize a desired frequency characteristic. Especially, there is a problem that it is extremely difficult to obtain an ideal frequency characteristic having an inhibition band (band between pass band and cutoff band) with a steep inclination.

Furthermore, obtaining a desired frequency characteristic using the conventional filter design method requires a trial and error method of subjecting the filter coefficients obtained to an FFT while checking the frequency characteristic. Thus, the conventional art requires skilled technicians to take time and trouble its design for and has a problem that it is not easy to design an FIR filter of a desired characteristic easily.

A method of realizing a steep frequency characteristic by cascading a plurality of FIR filters produced using the above described conventional method is known (e.g., see Japanese Patent Laid-Open No. 5-243908). Furthermore, a method of adjusting a filter bank band by inserting a plurality of zero values between taps (between filter coefficients) of a tapped delay line is also known (e.g., see National Publication of International Patent Application No. 6-503450). However, according to these methods, the filter pass band becomes narrower than before adjustment and it is not possible to widen the bandwidth of the pass band to have a steep inclination.

SUMMARY OF THE INVENTION

The present invention has been implemented to solve the above described problems and it is an object of the present invention to provide a simple filter design method for widening a bandwidth of a frequency characteristic to have a steep inclination and a new FIR digital filter having an ideal frequency characteristic with a steep inclination.

In order to solve the above described problems, the digital filter design method according to the present invention includes a first step of generating a first filter coefficient of a symmetric numeric string, a second step of obtaining a symmetric second filter coefficient realizing a second frequency-amplitude characteristic having a contact point at a position where the maximum value is acquired in a first frequency-amplitude characteristic expressed by the first filter coefficient and having the minimum value at the contact point, and a third step of executing a calculation to obtain a third filter coefficient obtained when a first filter having the first filter coefficient and a second filter having the second filter coefficient are cascaded, and determines the third filter coefficient generated in the third step as the filter coefficient to be obtained.

Furthermore, the digital filter according to the present invention includes an original filter having a first filter coefficient of a symmetric numeric string and an adjustment filter having a symmetric second filter coefficient realizing a frequency-amplitude characteristic having a contact point at a position where the maximum value is acquired in a frequency-amplitude characteristic of the original filter and having the minimum value at the contact point, and is constructed by cascading the original filter and the adjustment filter.

Furthermore, the digital filter may also be constructed of a single filter for which the third filter coefficient determined using the above described design method is set as a filter coefficient for a signal of each tap.

According to the present invention having such a structure, it is possible to simply design an FIR digital filter with a frequency characteristic having a relatively wide pass band and an inhibition band having a steep inclination without using any window function or approximate expression.

BRIEF DESCRIPTION OF THE DRAWINGS

FIG. 11 illustrates filter coefficients of a basic low pass filter L4an;

FIGS. 14A and 14B illustrate a frequency-gain characteristic of the basic low pass filter L4an;

DETAILED DESCRIPTION OF THE PREFERRED EMBODIMENTS

Figure 1:
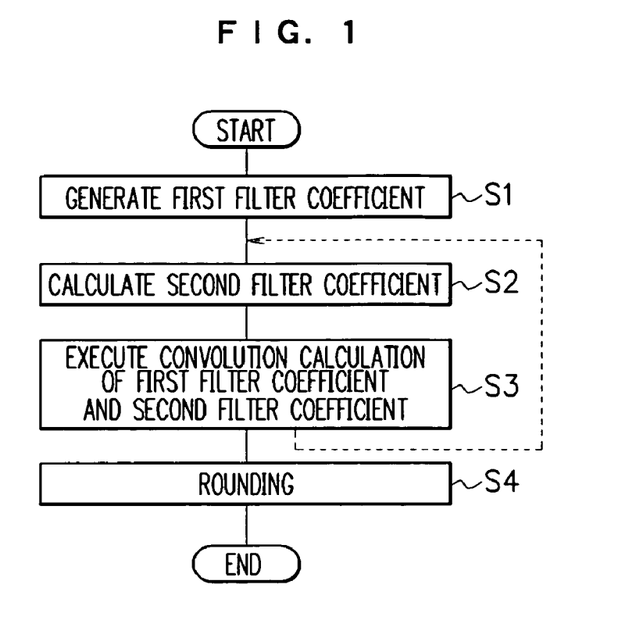
FIG. 1 is a flow chart showing a procedure of an FIR digital filter design method according to an embodiment of the present invention.
Figure 2:
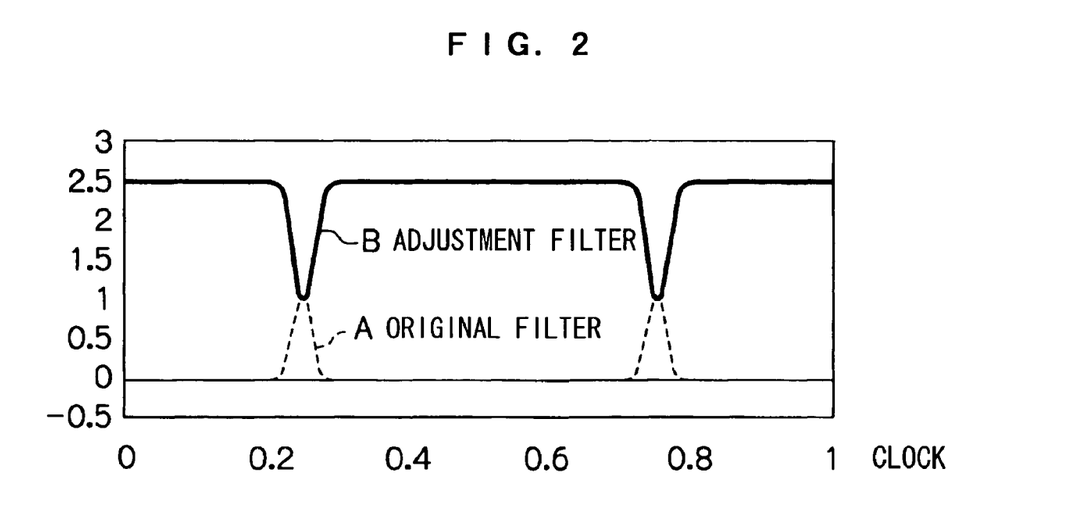
FIG. 2 is a frequency characteristic diagram illustrating the concept of the FIR digital filter design method according to this embodiment.

With reference now to the attached drawings, an embodiment of the present invention will be described below. FIG. 1 is a flow chart showing a procedure of an FIR digital filter design method according to an embodiment of the present invention. Furthermore, FIG. 2 is a frequency characteristic diagram illustrating the concept of the FIR digital filter design method according to this embodiment.

In FIG. 1, a first filter coefficient of a symmetric numeric string is generated first (step S1). The method of generating this first filter coefficient is not particularly limited in the present invention. If the numeric string of the filter coefficient is symmetric, a conventional design method using an approximate expression or window function may be used or the design method proposed by the present inventor in the past (e.g., Japanese Patent Application No. 2001-365146, Japanese Patent Application No. 2002-129168, Japanese Patent Application No. 2002-205014, Japanese Patent Application No. 2002-306315, Japanese Patent Application No. 2002-306316, Japanese Patent Application No. 2003-56265, etc.) may be used.

The filter design method proposed by the present inventor in the past can be summarized as follows. The first design method described in Japanese Patent Application No. 2001-365146 is a method whereby a plurality of amplitude values indicating a desired frequency characteristic are input, the input numeric string is subjected to an inverse Fourier transform, the numeric string obtained is subjected to windowing and thereby filter coefficients are obtained. Furthermore, the second design method described in Japanese Patent Application No. 2002-129168, Japanese Patent Application No. 2002-205014, Japanese Patent Application No. 2002-306315 and Japanese Patent Application No. 2002-306316 is a method whereby more than one basic unit filter made up of a predetermined basic numeric string is created and these basic unit filters are arbitrarily cascaded and thereby filter coefficients are obtained.

Furthermore, the third design method described in Japanese Patent Application No. 2003-56265 is a method whereby an FIR calculation is executed based on a filter coefficient made up of a predetermined basic numeric string, then moving average calculations are repeated n times on the calculation data by adding up original data before the calculation and previous data ahead of the original data by a predetermined amount of delay, adjusting the amplitude and outputting the data. Using the second design method or third design method is preferable from the standpoint that it is possible to obtain a frequency characteristic having a good attenuation characteristic with a small number of taps.

The frequency characteristic indicated by reference characteristic A in FIG. 2 is an example of a frequency-gain characteristic of an original filter realized by the first filter coefficient generated in step S1. Here, the gain and frequency of the frequency characteristic of the original filter are shown normalized with "1" (normalization).

Next, a symmetric second filter coefficient realizing a frequency-amplitude characteristic (B in FIG. 2) having a contact point at a position where the maximum value is acquired in the frequency-amplitude characteristic (A in FIG. 2) expressed by the first filter coefficient and having the minimum value at the contact point is obtained (step S2). When the frequency-amplitude characteristic has such features, any method can be used to generate the second filter coefficient, and, for example, the second filter coefficient can be obtained through the following calculation.

That is, assuming that the numeric string of the first filter coefficient making up the original filter is $\{H_m, H_{m-1}, \ldots, H_1, H_0, H_{-1}, \ldots, H_{-(m-1)}, H_{-m}\}$ ($H_0$ is a central value and the numeric string is symmetric with respect to the central value; $H_m = H_{-m}$, $H_{m-1} = H_{-(m-1)}$, ..., $H_1 = H_{-1}$), the second filter coefficient is obtained through a calculation $\{-kH_m, -kH_{m-1}, \ldots, -kH_1, -kH_0+(1+k), -kH_{-1}, \ldots, -kH_{-(m-1)}, -kH_{-m}\}$ (k is an arbitrary positive number). That is, all coefficients other than the central value are multiplied (-k)-fold and only the central value is multiplied (-k)-fold and (1+k) is added thereto and the second filter coefficient is thereby obtained. Hereinafter, the filter having this second filter coefficient will be referred to as an "adjustment filter."

Once the second filter coefficient is obtained in this way, a calculation is executed to obtain a third filter coefficient which is obtained when the original filter having a first filter coefficient and the adjustment filter having a second filter coefficient are cascaded (step S3). By cascading the original filter and adjustment filter, the first filter coefficient and second filter coefficient are multiplied and added up and a new filter coefficient is thereby created.

Figure 3:
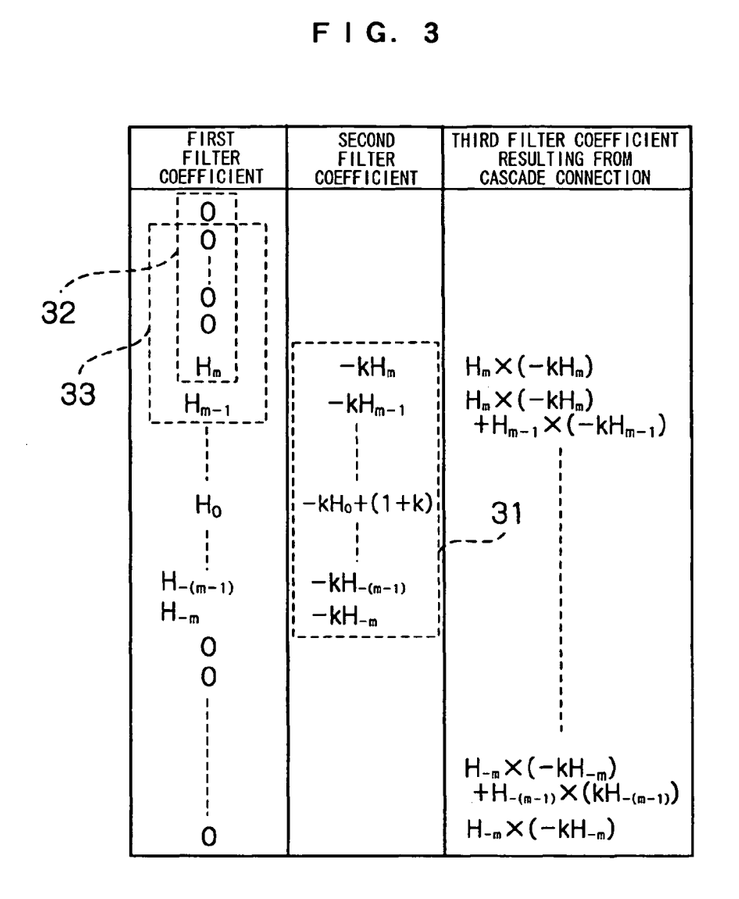
FIG. 3 illustrates calculation contents when a second filter coefficient is calculated.

FIG. 3 illustrates calculation contents in step S3. As shown in this FIG. 3, in step S3, a convolution calculation between (2m+1) (2m+1 represents the total number of elements of the numeric string making up the first filter coefficient) elements of the numeric string making up the first filter coefficient and (2m+1) elements of the numeric string of making up the second filter coefficient is executed to obtain the numeric string of the third filter coefficient.

In this convolution calculation, for the second filter coefficient, the entire numeric string of $\{-kH_m, -kH_{m-1}, \ldots, -kH_1, -kH_0+(1+k), -kH_{-1}, \ldots, -kH_{-(m-1)}, -kH_{-m}\}$ is always subjected to a multiplication and addition in a fixed manner.

On the other hand, for the first filter coefficient, assuming that there are "0" strings before and after the numeric string $\{H_m, H_{m-1}, \ldots, H_1, H_0, H_{-1}, \ldots, H_{-(m-1)}, H_{-m}\}$, the numeric string of (2m+1) elements including these "0" values are subjected to a convolution calculation. At this time, when the nth numeric value in the third filter coefficient is calculated, the nth numeric value of the first filter coefficient and the numeric string of (2m+1) elements ahead thereof are subjected to a multiplication and addition.

For example, when the first numeric value of the third filter coefficient is calculated, the entire numeric string $\{-kH_m, -kH_{m-1}, \ldots, -kH_1, -kH_0+(1+k), -kH_{-1}, \ldots, -kH_{-(m-1)}, -kH_{-m}\}$ (array enclosed by a dotted line indicated by reference numeral 31) of the second filter coefficient and the first numeric value of the first filter coefficient and a numeric string of (2m+1) elements $\{0, 0, \ldots, 0, H_m\}$ (array enclosed by a dotted line indicated by reference numeral 32) ahead thereof are subjected to a calculation of summing the products of corresponding elements of the array. That is, the calculation result in this case is $(H_m \times (-kH_{-m}))$.

Furthermore, when the second numeric value of the third filter coefficient is calculated, the entire numeric string of the second filter coefficient $\{-kH_m, -kH_{m-1}, \ldots, -kH_1, -kH_0+(1+k), -kH_{-1}, \ldots, -kH_{-(m-1)}, -kH_{-m}\}$ (array enclosed by a dotted line indicated by reference numeral 31) and the second numeric value of the first filter coefficient and a numeric string of (2m+1) elements $\{0, 0, \ldots, 0, H_m, H_{m-1}\}$ (array enclosed by a dotted line indicated by reference numeral 33) ahead thereof are subjected to a calculation for summing the products of the corresponding elements of the array. That is, the calculation result in this time is $(H_m \times (-kH_{-m}) + H_{m-1} \times (-kH_{-(m-1)}))$. In the same way, a numeric string of (2×(2m+1)−1) elements making up the third filter coefficient will be calculated.

Here, the case where one adjustment filter is cascaded to the original filter has been described as an example, but a plurality of adjustment filters may also be cascaded. In this case, as shown with the dotted line arrow in FIG. 1, the third filter coefficient generated in step S3 is newly regarded as the first filter coefficient and the process is returned to step S2. A second filter coefficient is obtained again (a new adjustment filter is generated) based on the new first filter coefficient (corresponds to a numeric string output from the first adjustment filter when a single pulse is input to the original filter).

Furthermore, the new first filter coefficient and new second filter coefficient generated in this way are subjected to a convolution calculation and a new third filter coefficient is thereby calculated which is obtained when a new adjustment filter is further cascaded. Such a calculation is repeated the number of times corresponding to the number of adjustment filters to be cascaded.

Figure 4:
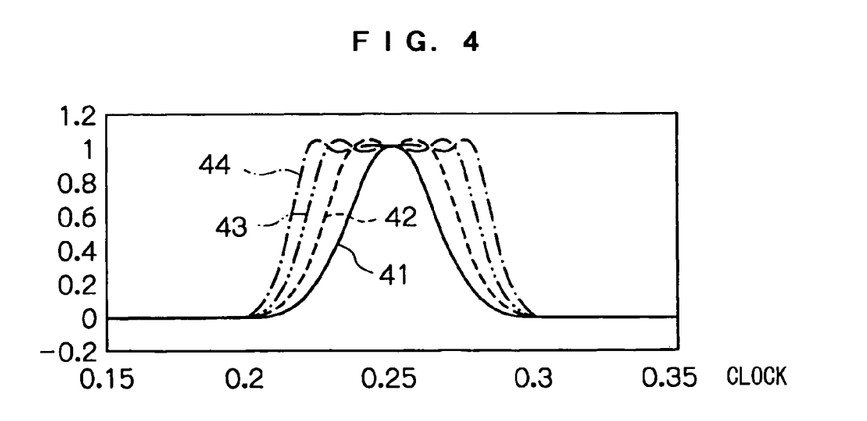
FIG. 4 illustrates a frequency-amplitude characteristic of an original band pass filter and a frequency-amplitude characteristic obtained when 1 to 3 adjustment filters are cascaded to this original band pass filter.

FIG. 4 illustrates a frequency-amplitude characteristic of an original filter (band pass filter) and a frequency-amplitude characteristic obtained when 1 to 3 adjustment filters are cascaded to this original filter. In FIG. 4, reference numeral 41 denotes a frequency-amplitude characteristic of the original filter, 42 denotes a frequency-amplitude characteristic obtained when one adjustment filter is cascaded, 43 denotes a frequency-amplitude characteristic obtained when two adjustment filters are cascaded and 44 denotes a frequency-amplitude characteristic obtained when three adjustment filters are cascaded.

As shown in this FIG. 4, by cascading the adjustment filters of this embodiment to the original filter, it is possible to widen the pass band of the filter and make the inclination of the inhibition band steeper. Increasing the number of the cascaded adjustment filters allows a filter characteristic with a wider pass band and with steeper inclination to be obtained.

This FIG. 4 shows a frequency characteristic when the value of parameter k in calculating the second filter coefficient from the first filter coefficient is assumed to be 1.5. As shown in FIG. 4, when k≠1, a certain degree of overshoot and ringing appear at the vertex of the frequency characteristic. However, when k=1, no overshoot or ringing appears at the vertex of the frequency characteristic and the characteristic becomes flat.

Figure 5A:
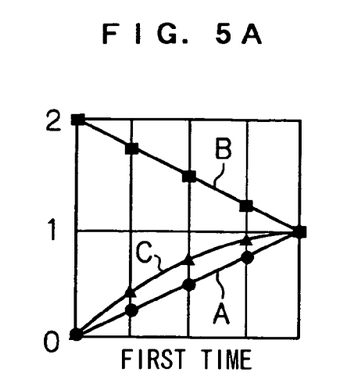
FIGS. 5A and 5B illustrate a principle of a variation in the frequency characteristic obtained when the adjustment filters of this embodiment are cascaded.
Figure 5B:
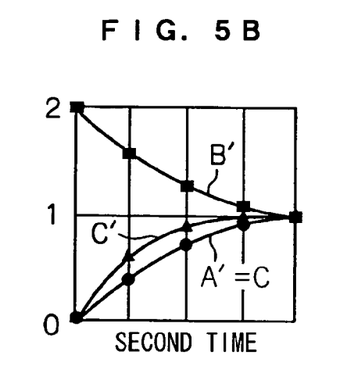

FIGS. 5A and 5B illustrate a principle of a variation in the frequency characteristic obtained when the adjustment filters of this embodiment are cascaded. Note that this FIGS. 5A and 5B are intended to explain the basic principle and it does not match the waveform of the frequency characteristic shown in FIG. 4. This FIGS. 5A and 5B show a principle when k=1 is set.

FIG. 5A shows a variation in the frequency-amplitude characteristic when the first adjustment filter is cascaded to the original filter. In FIG. 5A, reference characteristic A shows the frequency-amplitude characteristic of the original filter, B shows the frequency-amplitude characteristic of the first adjustment filter having a second filter coefficient generated from the first filter coefficient of the original filter and C shows the frequency-amplitude characteristic obtained when the original filter and the first adjustment filter are cascaded.

That is, the new frequency-amplitude characteristic C when one adjustment filter is cascaded to the original filter takes the form of the frequency-amplitude characteristic A of the original filter multiplied by the frequency-amplitude characteristic B of the adjustment filter. When the second adjustment filter is further cascaded, the third filter coefficient corresponding to the frequency-amplitude characteristic C generated in this way is newly used as the first filter coefficient and a new second filter coefficient for the second adjustment filter is obtained.

FIG. 5B shows a variation in the frequency-amplitude characteristic when a second adjustment filter is further cascaded. In FIG. 5B, reference characteristic A' shows the frequency-amplitude characteristic when the first adjustment filter is cascaded and is identical to the frequency-amplitude characteristic C obtained using the procedure in FIG. 5A. Reference characteristic B' shows the frequency-amplitude characteristic of the second adjustment filter having a new second filter coefficient generated from the new first filter coefficient corresponding to the frequency-amplitude characteristic A'. Reference characteristic C' shows a new frequency-amplitude characteristic obtained when a second adjustment filter is further cascaded and it takes the form of a multiplication between the two frequency-amplitude characteristics A', B'.

Though not shown here, when a third adjustment filter is further cascaded, a filter coefficient corresponding to the new frequency-amplitude characteristic C' generated using the procedure in FIG. 5B is used again as the first filter coefficient and a new second filter coefficient for the third adjustment filter is calculated. Then, a new frequency-amplitude characteristic is obtained according to a procedure similar to the above described procedure.

Thus, by cascading a plurality of adjustment filters to the original filter, it is possible to widen the pass band of the filter and make the inclination of the inhibition band steeper. When k=1, the frequency-amplitude characteristic of the original filter and the frequency-amplitude characteristic of the adjustment filter are axisymmetric with respect to the line whose amplitude is "1". Therefore, no matter how many adjustment filters are connected, the frequency-amplitude characteristic of the new filter obtained through the multiplication never exceeds the line whose amplitude is "1" and no overshoot or ringing occurs. From this, the value of k is preferably set to "1".

On the other hand, when the value of k is set to a value greater than 1, overshoot or ringing of a certain degree occurs, but it is possible to increase the rate of the pass band that can be widened through the connection of one adjustment filter. Therefore, when the pass band is preferably widened efficiently using a small number of adjustment filters, the value of k is preferably increased. In this case, by connecting an adjustment filter with k=1 in the final stage after cascading a plurality of adjustment filters for which the second filter coefficient is obtained assuming k≠1, it is possible to efficiently widen the pass band and obtain a good frequency characteristic with no overshoot or ringing.

Figure 6:
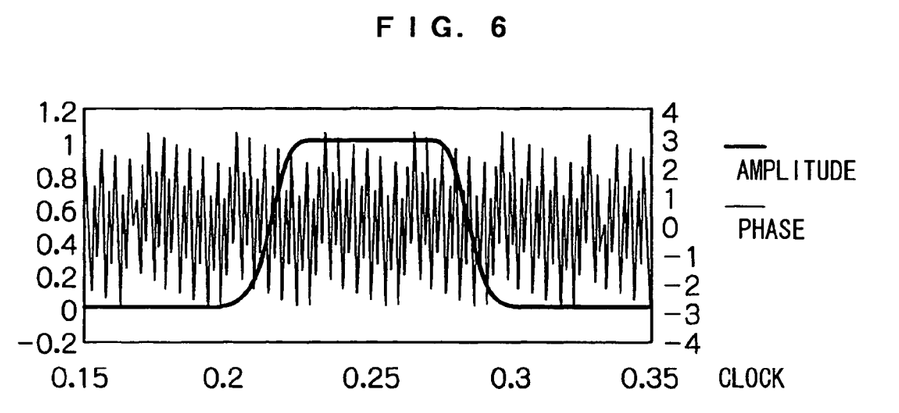
FIG. 6 illustrates a frequency characteristic obtained when three adjustment filters with k=1.5 are cascaded to the original band pass filter and an adjustment filter with k=1 is further cascaded in the final stage.

FIG. 6 illustrates a frequency characteristic obtained when three adjustment filters with k=1.5 are cascaded to the original band pass filter and an adjustment filter with k=1 is further cascaded in the final stage. As is appreciated from this FIG. 6, when the adjustment filter with k=1 is connected in the final stage, it is possible to obtain a good frequency characteristic having a wide pass band, inhibition band with a steep inclination and flat vertex. Furthermore, since the filter coefficient is of a symmetric type, the linearity of the phase can also be secured. Furthermore, by adjusting the value of k to k<1, the bandwidth of the pass frequency band can also be finely adjusted.

Figure 7:
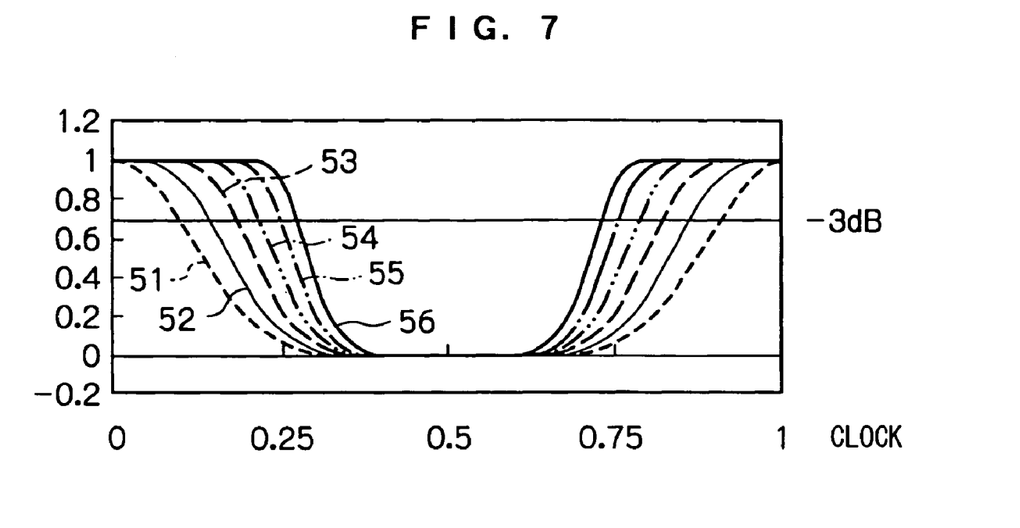
FIG. 7 illustrates a frequency-amplitude characteristic of the original low pass filter and a frequency-amplitude characteristic obtained when 1 to 5 adjustment filters are cascaded to this original low pass filter.

A design example of a band pass filter has been described so far, but a low pass filter or high pass filter can also be designed using a similar procedure. FIG. 7 illustrates a frequency-amplitude characteristic of the original low pass filter and a frequency-amplitude characteristic obtained when 1 to 5 adjustment filters are cascaded to this original low pass filter. This FIG. 7 shows the frequency characteristic assuming k=1.

In FIG. 7, reference numeral 51 denotes a frequency-amplitude characteristic of the original low pass filter and 52 to 56 denote frequency-amplitude characteristics obtained when 1 to 5 adjustment filters are cascaded respectively. As shown in this FIG. 7, in the case of the low pass filter as well as the band pass filter in FIG. 4, it is possible to widen the bandwidth of the pass band of the filter and make the inclination of the inhibition band steeper by cascading the adjustment filter. Furthermore, it is also possible to obtain a filter characteristic with a wider pass band and steeper inclination by increasing the number of adjustment filters cascaded.

Figure 8:
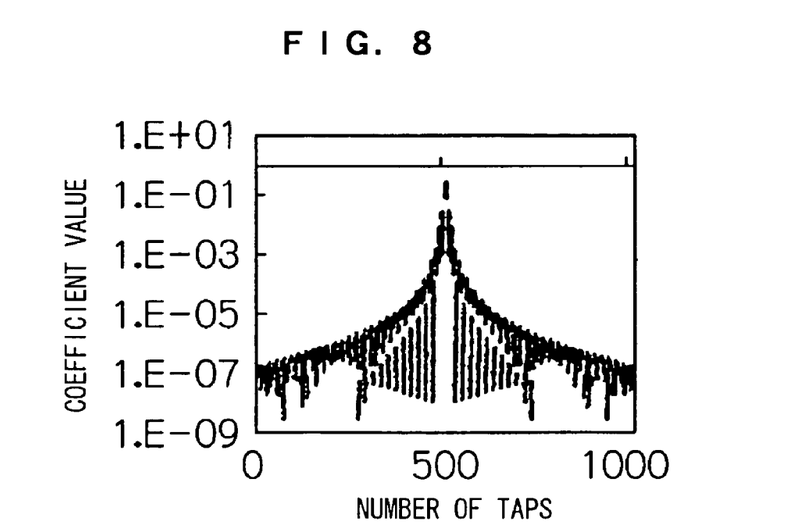
FIG. 8 is a graph of filter coefficient values actually calculated with 16-bit calculation accuracy (before rounding)
Figure 9A:
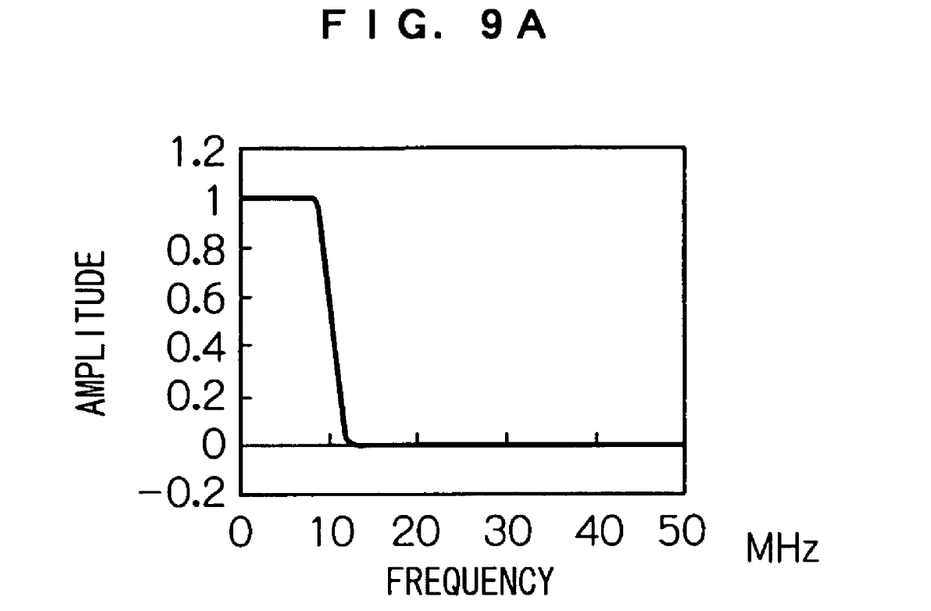
FIGS. 9A and 9B illustrate a frequency characteristic of a digital filter before rounding a filter coefficient.
Figure 9B:
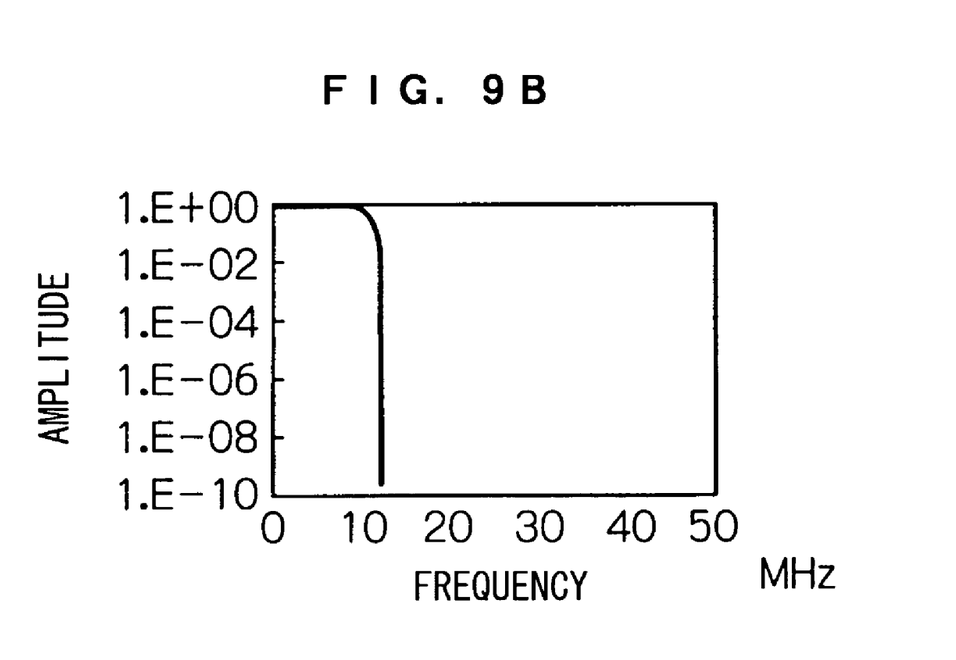

Finally, by applying rounding for reducing the number of bits to the third filter coefficient generated as shown above, it is possible to drastically reduce unnecessary filter coefficients and simplify the filter coefficients through a conversion to an integer (step S4). The rounding in this step S4 will be described in detail below. FIG. 8 is a graph of third filter coefficient values (before rounding) calculated with 16-bit calculation accuracy using the above described procedure in steps S1 to S3. Furthermore, FIGS. 9A and 9B illustrate a frequency characteristic of a digital filter before rounding a filter coefficient, FIG. 9A shows the gain on a rectilinear scale and FIG. 9B shows the gain on a logarithmic scale.

When a first filter coefficient is obtained using the second filter design method or third filter design method proposed by the present inventor in the past and a second filter and a third filter coefficients are obtained based on this using the above described procedure, the value of the third filter coefficient becomes a maximum in the center (coefficient $H_0$) as shown in FIG. 8. Furthermore, the difference in the respective filter coefficient values becomes extremely large compared to filter coefficients obtained using a conventional filter design method. For this reason, even if filter coefficients having a value smaller than a predetermined threshold are discarded by rounding, most of principal filter coefficients which determine the frequency characteristic remain and hardly cause adverse influences on the frequency characteristic. Furthermore, while the attenuation amount out of band of the frequency characteristic is restricted by the number of bits of the filter coefficients, the frequency characteristic obtained by the second or third filter design method as shown in FIG. 9 has very deep attenuation, and therefore even if the number of bits is reduced to a certain degree, a desired amount of attenuation can be secured.

Therefore, rounding can drastically reduce unnecessary filter coefficients. For example, by discarding several low-order bits of filter coefficients and thereby reducing the number of bits, it is possible to round all filter coefficients having values smaller than a maximum value expressed by those several low-order bits to "0" and discard them. Therefore, no conventional windowing is necessary to reduce the number of filter coefficients.

This is a characteristic point of this embodiment which is considerably different from the conventional filter design method. That is, the difference in values of filter coefficients calculated in the conventional filter design method does not become significantly large, and therefore if rounding is carried out with the values of the filter coefficients, principal filter coefficients which determine the frequency characteristic are also often discarded. Furthermore, since it is difficult to obtain a frequency characteristic having a very deep attenuation amount out of band and if the number of bits of filter coefficients is reduced, it is no longer possible to secure a necessary attenuation amount out of band. Therefore, it has been conventionally impossible to perform rounding to reduce the number of bits and it cannot help but reduce the number of filter coefficients through windowing. For that reason, discretization errors would occur in the frequency characteristic and it has been extremely difficult to obtain a desired frequency characteristic.

In contrast, this embodiment allows filters to be designed without windowing, and so prevents discretization errors from occurring in the frequency characteristic. Therefore, it is possible to improve the cut-off characteristic considerably and obtain excellent filter characteristics with a rectilinear phase characteristic. In the frequency-gain characteristic, ripples in the flat section are extremely small and can be fully reduced to within a range of ±0.3 dB.

The value of the third filter coefficient calculated in the above described procedure is a decimal fraction and the number of its digits can be reduced through 10-bit rounding, but it is a set of random values. This numeric string can be used as is as the filter coefficient, but to reduce the number of multipliers used when mounting a digital filter, the numeric values of filter coefficients can be further rounded and simplified. For this purpose, in this embodiment, the numeric string of the filter coefficient rounded to 10 bits is subjected to rounding of multiplying $2^{10}$-fold the numeric string and rounding the decimal fractions so as to round the coefficient value to an integer.

When such rounding to an integer is executed, it is possible to construct the digital filter so as to multiply the output signals from the respective taps of the digital filter by integer filter coefficients individually, adding up all the multiplication outputs and multiply the addition result $\frac{1}{2}^{10}$-fold. Moreover, the integer filter coefficient can be expressed by an addition of binary numbers such as $2^i+2^j+\ldots$ (i, j are arbitrary integers). This makes it possible to construct a coefficient unit using a bit shift circuit instead of multipliers and simplify the structure of the digital filter to be mounted.

Note that the processing of discarding several lower bits of data of filter coefficients and thereby rounding y-bit data to x bits (x<y) has been described as an example of rounding, rounding is not limited to this example. For example, it is also possible to compare the value of each filter coefficient with a predetermined threshold and discard a filter coefficient which is smaller than the threshold. In this case, since the remaining filter coefficients continue to have the original y bits and so the filter coefficients are multiplied $2^y$-fold when these are converted to integers.

The device for implementing the filter design method according to this embodiment described above can be realized any one of a hardware structure, DSP or software. For example, when the device is realized by software, the filter design device according to this embodiment is actually constructed of a CPU, MPU, RAM or ROM of a computer and the device can be realized by operating a program stored in a RAM, ROM or hard disk, etc.

For example, filter coefficients of various basic filters about the second or third design method are stored as data in a storage device such as a RAM, ROM or hard disk. When the user instructs an arbitrary combination or connection order concerning the basic filters, the CPU calculates a first filter coefficient of the original filter corresponding to the instructed contents using the data of the filter coefficients stored in the storage device.

Furthermore, when the user instructs and inputs parameter k on the adjustment filter and the number of cascade connections of the adjustment filter, the CPU can calculate a second filter coefficient from the first filter coefficient and further calculate a third filter coefficient from the second filter coefficient. In this case, the storage device corresponds to the filter coefficient storage means and the CPU corresponds to the calculation means of the present invention.

When the user instructs the combination and connection order of the respective basic filters, parameter k on the adjustment filter and the number of cascade connections of the adjustment filter, etc., the user interface can be constructed arbitrarily. For example, the user interface may be adapted so as to be able to select the type of a basic filter from a list shown on a screen by operating a keyboard or mouse and input values of various parameters by operating the keyboard or mouse. The CPU acquires information input in this way and obtains the filter coefficient corresponding to the contents instructed by the input information through the above described calculation.

Furthermore, various basic filters are iconized and shown on the display screen (filter coefficients corresponding to the respective icons are stored as data in the storage device) and the user combines and arranges these icons in an arbitrary combination on the display screen by operating the keyboard and mouse. Furthermore, the user inputs other necessary parameters by operating the keyboard and mouse. The embodiment may also be adapted so that the CPU automatically calculates and determines the array of icons and filter coefficients corresponding to the input parameters.

Furthermore, it is also possible to execute calculations to sequentially obtain a first filter coefficient, second filter coefficient and third filter coefficient using the function features of a spreadsheet installed in a personal computer, etc. Calculations in this case are executed through the CPU, ROM, RAM, etc., of the personal computer in which the spreadsheet is installed.

Furthermore, the calculated filter coefficients may be automatically FFT-transformed and the result may be displayed on the display screen as a frequency-gain characteristic diagram. By doing so, it is possible to visually check the frequency characteristic of the designed filter and carry out the filter design more easily.

Such a filter design device can be realized by recording a program which causes a computer to operate so as to realize the function of this embodiment in a storage medium such as a CD-ROM and causing the computer to read this program. As the storage medium for recording the program, it is possible to use a flexible disk, hard disk, magnetic tape, optical disk, magneto-optical disk, DVD or non-volatile memory card, etc., in addition to CD-ROM. Furthermore, the above described program may also be downloaded to the computer through a network such as the Internet.

Note that not only in the case where the above described functions of the embodiment are realized by the computer executing the supplied program but also in the case where the program is cooperating with an OS (operating system) or other application software operating on the computer to execute the functions of the above described embodiment or in the case where a function enhancement board or function enhancement unit of the computer is executing the whole or part of the processing of a supplied program to execute the functions of the above described embodiment, such a program is also included in the embodiment of the present invention.

Figure 10:
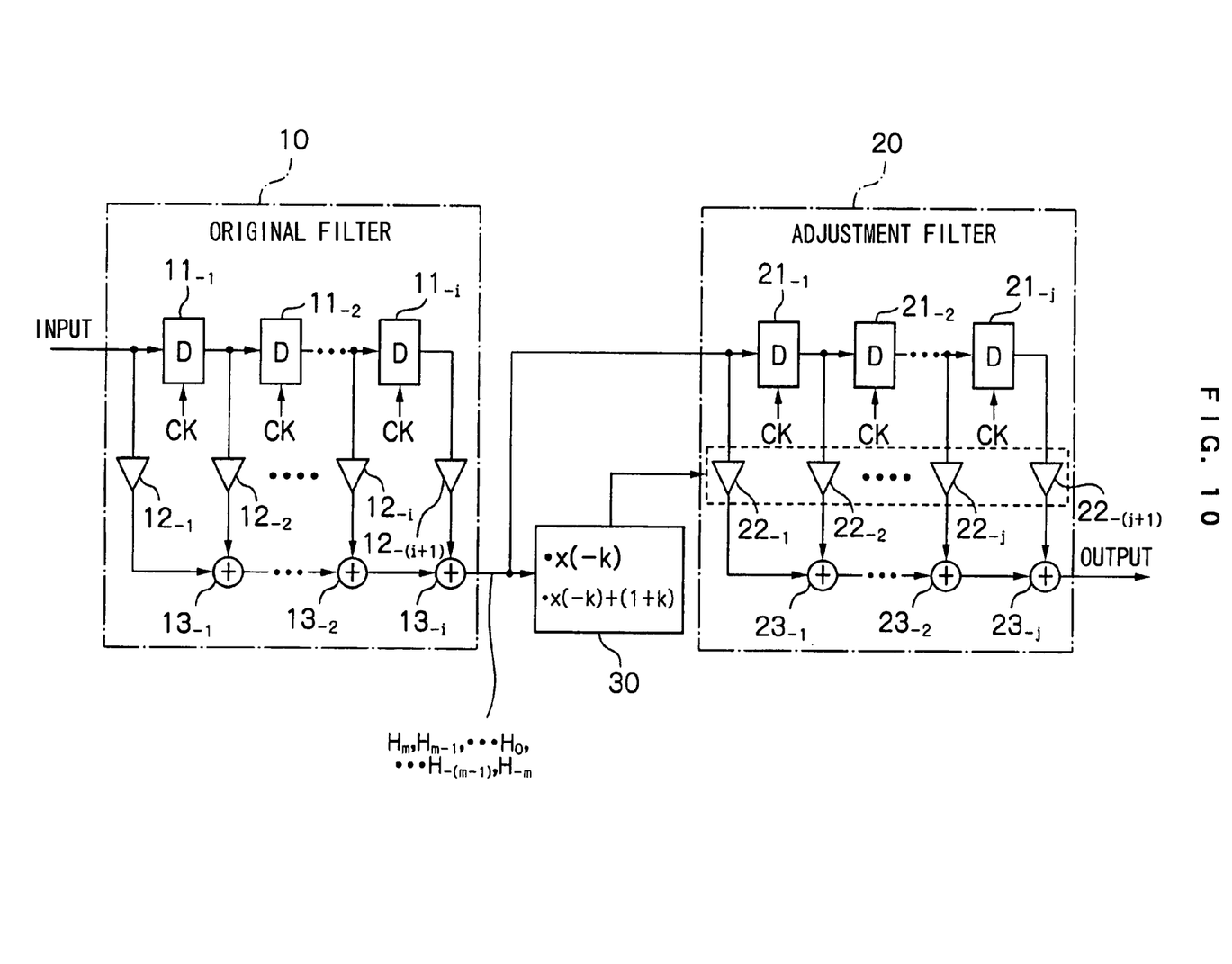
FIG. 10 illustrates an example of the structure of the digital filter according to this embodiment.

Next, the structure of the digital filter according to this embodiment will be described. When the digital filter is actually mounted in an electronic apparatus or semiconductor IC, it is possible to construct both the original filter and adjustment filter as hardware and mount the digital filter by connecting the filters as hardware. FIG. 10 illustrates an example of the structure of the digital filter in that case. The digital filter shown in FIG. 10 is constructed of one original filter 10 and one adjustment filter 20 cascaded together. The original filter 10 is constructed of i D-type flip flops $11_{-1}$ to $11_{-i}$, (i+1) coefficient units $12_{-1}$ to $12_{-(i+1)}$ and i adders $13_{-1}$ to $13_{-i}$ cascaded together.

The i D-type flip flops $11_{-1}$ to $11_{-i}$ sequentially delay input data by 1 clock CK at a time. The (i+1) coefficient units $12_{-1}$ to $12_{-(i+1)}$ multiply signals extracted from the input/output taps of the respective D-type flip flops $11_{-1}$ to $11_{-i}$ by symmetric first filter coefficients. The i adders $13_{-1}$ to $13_{-i}$ add up all the multiplication results from the coefficient units $12_{-1}$ to $12_{-(i+1)}$ and outputs the addition result.

The data output from the original filter 10 is input to the adjustment filter 20 and at the same time input to the filter coefficient calculation section 30. The filter coefficient calculation section 30 calculates second filter coefficients to be set in the adjustment filter 20 based on the output data from the original filter 10.

That is, assuming that the data string output from the original filter 10 when a single pulse is input to the original filter 10 is $\{H_m, H_{m-1}, \ldots, H_1, H_0, H_{-1}, \ldots, H_{-(m-1)}, \ldots, H_{-m}\}$, the filter coefficient calculation section 30 calculates second filter coefficients through a calculation $\{-kH_m, -kH_{m-1} \ldots, -kH_1, -kH_0+(1+k), -kH_{-1}, \ldots, -kH_{-(m-1)}, -kH_{-m}\}$ (k is an arbitrarily set positive number). The second filter coefficients obtained are set in the (j+1) coefficient units $22_{-1}$ to $22_{-(j+1)}$ in the adjustment filter 20 respectively.

The adjustment filter 20 is constructed of j (j>i) D-type flip flops $21_{-1}$ to $22_{-j}$, (j+1) coefficient units $22_{-1}$ to $22_{-(j+1)}$ and j adders $23_1$ to $23_{-j}$ cascaded together. The j D-type flip flops $21_{-1}$ to $21_{-j}$ sequentially delay the input data from the original filter 10 by 1 clock CK at a time. (j+1) coefficient units $22_{-1}$ to $22_{-(j+1)}$ multiply the signals extracted from the input/output taps of the respective D-type flip flops $21_{-1}$ to $21_{-j}$ by the symmetric second filter coefficients respectively. j adders $23_{-1}$ to $23_{-j}$ add up the multiplication results from the respective coefficient units $22_{-1}$ to $22_{-(j+1)}$ and output the addition result.

Here, an example of the structure with only one adjustment filter 20 cascaded to the original filter 10 is shown, but when two or more adjustment filters 20 are cascaded, the structure shown in FIG. 10 may be followed by a plurality of structures similar to those of the filter coefficient calculation section 30 and adjustment filter 20 (however, the number of coefficients necessary for the adjustment filters increases as the stage number increases).

Furthermore, instead of the cascade connection of the original filter 10 and adjustment filter 20 as shown in FIG. 10, it is possible to make up one digital filter with a plurality of D-type flip flops, a plurality of coefficient units and a plurality of adders and set the final filter coefficients obtained using the procedure shown in FIG. 1 in the plurality of coefficient units in the digital filter.

In such a case, the number of filter coefficients calculated has been drastically reduced through 10-bit rounding and at the same time has been converted to simple integers through $2^{10}$-fold rounding. Therefore, there are fewer taps and multipliers are basically not necessary and their function can be handled by a bit shift circuit and a desired frequency characteristic can be realized with a small circuit scale and with high accuracy.

Here, as described above, according to the filter design method of this embodiment, when the number of cascaded adjustment filters is increased, the number of filter coefficients necessary for the adjustment filters in the posterior stages increases. Therefore, in order to reduce the number of taps in the entire digital filter, it is preferable to reduce the number of filter coefficients used in the original filter which constitutes the original source. In this respect, according to the third design method described in Japanese Patent Application No. 2003-56265 already applied by the present inventor, it is possible to construct an original filter having a good frequency characteristic with quite a small number of taps. The contents of Japanese Patent Application No. 2003-56265 related to this third design method will be extracted and described below. Note that parameters such as m, i, j, x will be used in the following explanations, but they are completely different in meaning from those described above.

The third design method which has already been applied for a patent defines several types of basic filter groups having specific impulse responses and realizes an FIR filter of a desired frequency characteristic in the form of those basic filter groups arbitrarily cascaded. The basic filters are roughly divided into three types of a basic low pass filter, basic high pass filter and basic band pass filter. These basic filters will be described below.

<Basic Low Pass Filter Lman (m, n are Variables, n is a Natural Number)>

The filter coefficients of a basic low pass filter Lman can be obtained through a moving average calculation by sequentially adding up original data before the calculation and preceding data which is ahead thereof by a predetermined amount of delay taking a numerical string "−1, m, −1" as a starting point.

Figure 11:
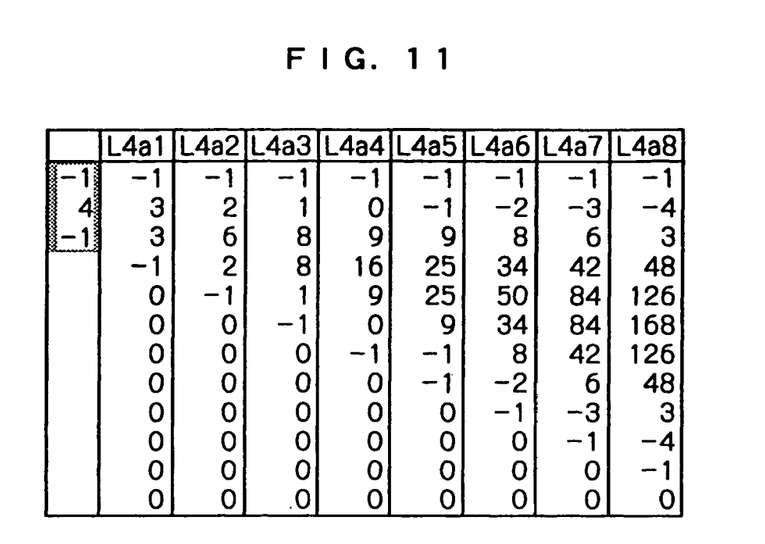

FIG. 11 illustrates filter coefficients of a basic low pass filter L4an (when m=4). In FIG. 11, in obtaining a jth filter coefficient from top of the nth column by a moving average calculation, the "original data" refers to the jth data from top of the (n−1)th column. On the other hand, the "preceding data" refers to the (j−1)th data from top of the (n−1)th column.

For example, the first numerical value "−1" from top of the basic low pass filter L4a1 is obtained by adding the original data "−1" to the preceding data "0", the second numerical value "3" is obtained by adding the original data "4" to the preceding data "−1." Furthermore, the third numerical value "3" is obtained by adding the original data "−1" to the preceding data "4" and the fourth numerical value "−1" is obtained by adding the original data "0" to the preceding data "−1."

Filter coefficients of any basic low pass filter L4an shown in FIG. 11 consist of a symmetric numerical string characterized in that the sums of every other value have the same sign and the same value (e.g., in the case of the basic low pass filter L4a4, −1+9+9+(−1)=16, 0+16+0=16).

The above described numerical string "−1, m, −1" is generated based on a basic numerical string "−1, N." A basic unit filter having this numerical string "−1, N" as filter coefficients has 1 or 2 (1 when N=0, and 2 otherwise) taps. The value of N need not necessarily be an integer.

Since the basic unit filter having this numerical string "−1, N" as filter coefficients is asymmetric, changing it to a symmetric type requires a plurality of basic unit filters to be cascade connected for use. For example, when two basic unit filters are cascade connected, the filter coefficients become "−N, $N^2$+1, −N" as a result of a convolution of the numerical string "−1, N." Here, assuming that $(N^2+1)/N=m$, where m is an integer, $N=(m+(m^2-4)^{1/2})/2$.

When m=4 as shown in the example of FIG. 11, $N=2+\sqrt{3}$. That is, the coefficients of the basic unit filter become "−1, 3.732" (here, up to three decimal places are shown). Furthermore, the filter coefficients when two basic unit filters are cascade connected become "−3.732, 14.928, −3.732." This numerical string has a relationship of −1:4:−1.

When this numerical string is actually used as filter coefficients, each value of the numerical string is divided by 2N ($=2*(2+\sqrt{3})=7.464$) so that the amplitude when the numerical string of the filter coefficients is subjected to an FFT transform becomes "1" and the gain is normalized to "1". That is, the numerical string of the filter coefficients to be actually used becomes "−½, 2, −½." This numerical string to be actually used "½, 2, −½" corresponds to the original numerical string "−1, 4, −1" multiplied by x times (x=1/(m−2)).

When the numerical string normalized as shown above is used as filter coefficients, the filter coefficients of the basic low pass filter Lman are characterized in that the sum total of the numerical string is "1" and the total values of every other value of the numerical string have the same sign and the same value.

Figure 12:
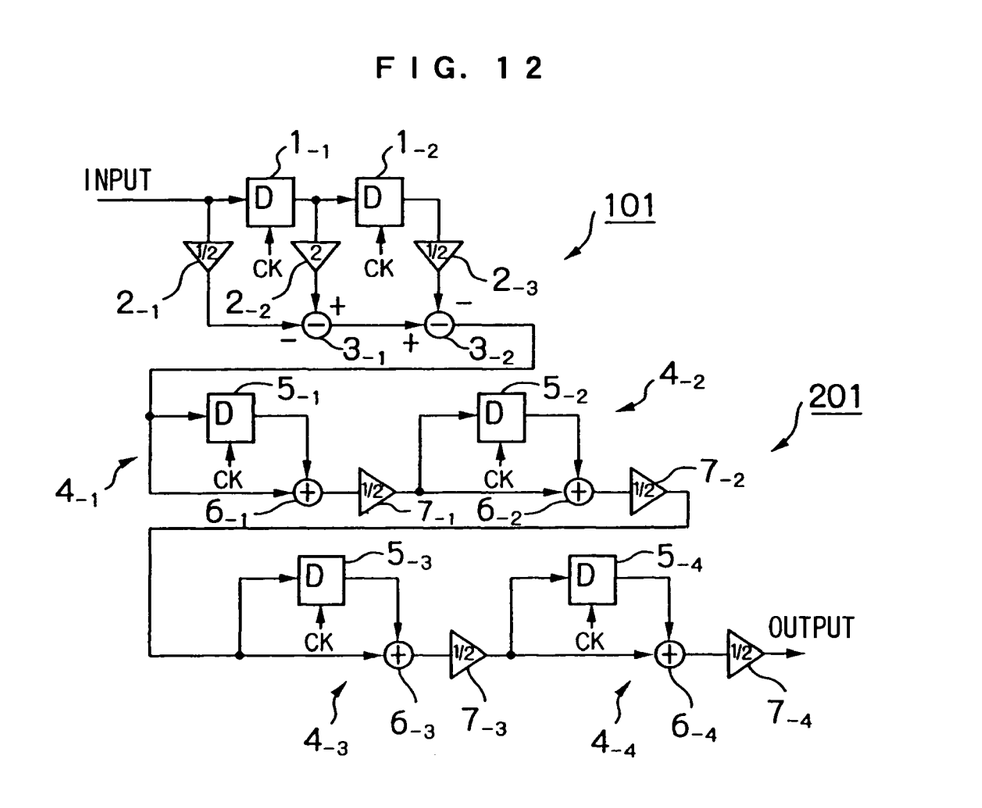
FIG. 12 illustrates an example of the hardware structure of a basic low pass filter L4a4.

FIG. 12 illustrates an example of the hardware structure of the basic low pass filter L4a4 (when m=4, n=4). As shown in FIG. 12, the basic low pass filter L4a4 is constructed by including an FIR calculation section 101 which has a numerical string "−½, 2, −½" which becomes a starting point as filter coefficients and a moving average calculation section 201 which applies the moving average calculation to the numerical string. Of these sections, the FIR calculation section 101 is constructed of two cascade connected D-type flip flops $1_{-1}$ and $1_{-2}$, three coefficient units $2_{-1}$ to $2_{-3}$ and two subtractors $3_{-1}$ and $3_{-2}$.

The two D-type flip flops $1_{-1}$ and $1_{-2}$ sequentially delay input data by 1 clock CK at a time. The three coefficient units $2_{-1}$ to $2_{-3}$ multiply the signals extracted from the input/output taps of the D-type flip flops $1_{-1}$ and $1_{-2}$ by filter coefficients of ½, 2, ½, respectively. The first subtractor $3_{-1}$ subtracts a multiplication result of the first coefficient unit $2_{-1}$ from a multiplication result of the second coefficient unit $2_{-2}$. Furthermore, the second subtractor $3_{-2}$ subtracts a multiplication result of third coefficient unit $2_{-3}$ from a subtraction result of the first subtractor $3_{-1}$.

Furthermore, the moving average calculation section 201 is constructed by cascade connecting four integrators $4_{-1}$ to $4_{-4}$ of the same structure. For example, the integrator $4_{-1}$ in the first stage is constructed of a D-type flip flop $5_{-1}$ that delays input data by 1 clock, an adder $6_{-1}$ that adds up original data which does not pass through the D-type flip flop $5_{-1}$ and preceding data which has been delayed by passing through the D-type flip flop $5_{-1}$ and an adjuster $7_{-1}$ for restoring the amplitude of the addition result.

According to the structure of the basic low pass filter L4a4 shown in this FIG. 12, it is only the FIR calculation section 101 in the first stage that requires coefficient units $2_{-1}$ to $2_{-3}$ that multiply data by filter coefficients and output taps which are output ports of data for the coefficient units $2_{-1}$ to $2_{-3}$. Moreover, the number of the coefficient units and output taps is only three.

Moreover, since the values of the filter coefficients are ½, 2, ½, the coefficient units $2_{-1}$ to $2_{-3}$ can be constructed of bit shift circuits. Furthermore, the adjusters $7_{-1}$ to $7_{-4}$ provided for the four integrators $4_{-1}$ to $4_{-4}$ can also be constructed of bit shift circuits. Even when the value of n is other than 4 and the number of adjusters is changed, all the adjusters can be constructed of bit shift circuits. Thus, no multiplier is required in the hardware structure of a basic low pass filter L4an.

Here, the case with m=4 has been explained, but if m=$2^i$ (i is an integer), all the coefficient units and adjusters can be constructed of bit shift circuits and no multiplier is required.

Figure 13:
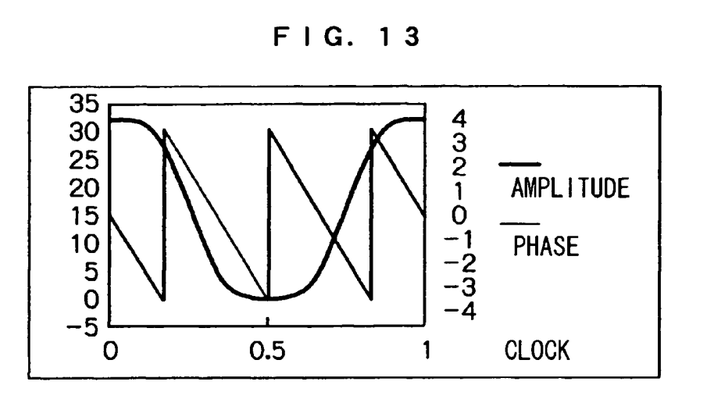
FIG. 13 illustrates a frequency characteristic of the basic low pass filter L4a4.

FIG. 13 shows a frequency characteristic (frequency-gain characteristic and frequency-phase characteristic) obtained by FFT transforming the numerical string of the filter coefficients of the basic low pass filter L4a4. Here, the gain is expressed on a straight scale and the normalized gain is multiplied 32-fold. On the other hand, the frequency is normalized with "1."

As is appreciated from this FIG. 13, a frequency-gain characteristic with a substantially flat pass band and a cut-off area with a gentle inclination is obtained. Furthermore, a substantially rectilinear frequency-phase characteristic is also obtained. Thus, the basic low pass filter L4a4 can obtain a preferable low pass filter frequency characteristic with no overshoot or ringing.

Figure 14A:
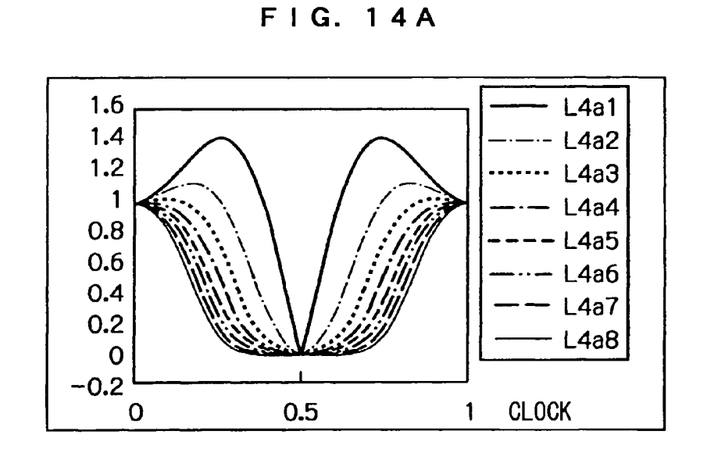
Figure 14B:
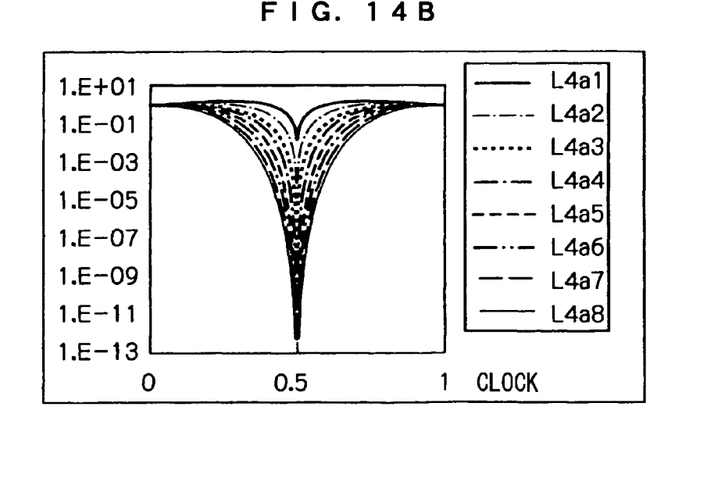

FIGS. 14A and 14B illustrate a frequency-gain characteristic of the basic low pass filter L4an, where n is a parameter, FIG. 14A shows the gain on a rectilinear scale and FIG. 14B shows the gain on a logarithmic scale. It is appreciated from FIG. 14 that the inclination of the inhibition band becomes steeper as the value of n increases and the bandwidth of the pass band becomes narrower. Furthermore, when the value of n is small, both ends of a vertex of the frequency characteristic rise. As the value of n increases, the vertex gradually flattens and becomes completely flat when n=4. When the value of n exceeds that value, then both ends of the vertex fall below the central value.

Here, the frequency characteristic when m=4 is shown here, but when the value of m is decreased, the inclination of the inhibition band becomes steeper and the bandwidth of the pass band becomes narrower. As stated above, it is possible to adjust the frequency characteristic of the basic low pass filter Lman by appropriately setting the values of parameters m, n.

<Basic High Pass Filter Hmsn (Where m, n are Variable, n is a Natural Number)>

The filter coefficients of a basic high pass filter Hmsn can be obtained through a moving average calculation by sequentially subtracting preceding data ahead of original data by a predetermined amount of delay from the original data before the calculation taking a numerical string "1, m, 1" as a starting point.

Figure 15:
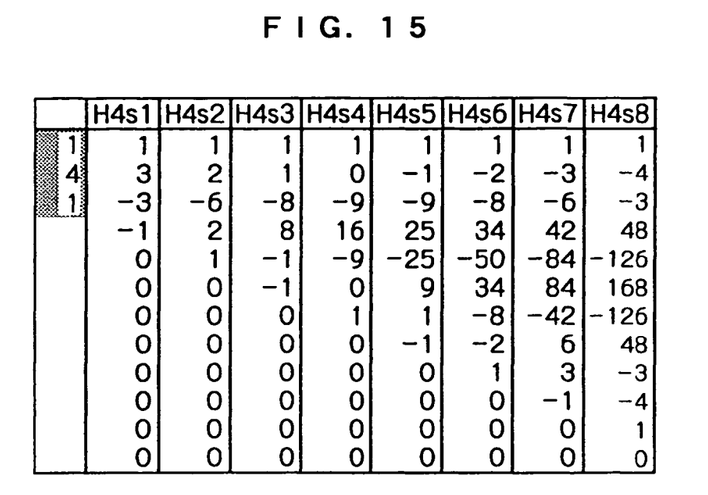
FIG. 15 illustrates filter coefficients of a basic high pass filter H4sn.

FIG. 15 illustrates filter coefficients of a basic high pass filter H4sn (when m=4). In FIG. 15, in obtaining the jth filter coefficient from top of the nth column through a moving average calculation, the "original data" refers to the jth data from top of the (n−1)th column. Furthermore, the "preceding data" refers to the (j−1)th data from top of the (n−1)th column.

For example, the first numerical value "1" from top of a basic high pass filter H4s1 is obtained by subtracting preceding data "0" from original data "1" and the second numerical value "3" is obtained by subtracting preceding data "1" from original data "4." Furthermore, the third numerical value "−3" is obtained by subtracting preceding data "4" from original data "1" and the fourth numerical value "−1" is obtained by subtracting preceding data "1" from original data "0."

In a basic high pass filter H4sn shown in FIG. 15, when n is an even number, filter coefficients of any numerical string are symmetric and are characterized in that the total values of every other value of the numerical string have opposite signs and the same value (for example, in the case of a basic high pass filter H4s4, 1+(−9)+(−9)+1=−16, 0+16+0=16). When n is an odd number, the absolute values of the numerical string are symmetric and the first half numerical string and the second half numerical string have opposite signs. Furthermore, the filter coefficients are characterized in that the total values of every other value of the numerical string have the opposite signs and the same value.

The above described numerical string "1, m, 1" is generated based on a basic numerical string "1, N." The basic unit filter using this numerical string "1, N" as filter coefficients has 1 or 2 taps (1 tap when N=0, 2 taps otherwise). Here, the value of N need not always be an integer.

Since the basic unit filter having this numerical string "1, N" as filter coefficients is asymmetric, changing it to a symmetric type requires a plurality of basic unit filters to be cascade connected for use. For example, when two basic unit filters are cascade connected, the filter coefficients become "N, N²+1, N" as a result of a convolution of the numerical string "1, N." Here, assuming that (N²+1)/N=m, where m is an integer, N=(m+(m²−4)^{1/2})/2.

When m=4 as shown in the example of FIG. 15, N=2+√3. That is, the coefficients of the basic unit filter become "1, 3.732" (here, up to three decimal places are shown). Furthermore, the filter coefficients when two basic unit filters are cascade connected become "3.732, 14.928, 3.732." This numerical string has a relationship of 1:4:1.

When this numerical string is actually used as filter coefficients, each value of the numerical string is divided by 2N (=2*(2+√3)=7.464) so that the amplitude when the numerical string of the filter coefficients is subjected to an FFT transform becomes "1" and the gain is normalized to "1." That is, the numerical string of filter coefficients to be actually used becomes "½, 2, ½." This numerical string to be actually used "½, 2, ½" also corresponds to the original numerical string "1, 4, 1" multiplied by x times (x=1/(m−2)).

When the numerical string normalized as shown above is used as filter coefficients, the filter coefficients of the basic high pass filter Hmsn are characterized in that the sum total of the numerical string is "0" and the total values of every other value of the numerical string have the opposite signs and the same value.

The illustration of the hardware structure of the basic high pass filter Hmsn is omitted here, but it is constructed in the same way as shown in FIG. 12. That is, the basic high pass filter Hmsn is constructed of an FIR calculation section having a numeric string "½, 2, ½" as filter coefficients to be a starting point and a moving average calculation section that applies a moving average calculation to this numeric string. In the hardware structure of this basic high pass filter Hmsn, it is only the FIR calculation section in the first stage that requires output taps and there are only a small number of taps. Furthermore, no multiplier is required.

The illustration of the frequency characteristic of the basic high pass filter Hmsn will also be omitted. As in the case of the basic low pass filter Lman, the pass band of its frequency-gain characteristic is substantially flat and shows a characteristic with the inhibition band having a gentle inclination. Furthermore, its frequency-phase characteristic also shows a rectilinear characteristic. That is, it is possible to obtain a high pass filter with a good frequency characteristic with no overshoot or ringing. Here, when the value of n is increased, the inclination of the inhibition band becomes steeper and the bandwidth of the pass band becomes narrower. Furthermore, when the value of n is decreased, the inclination of the inhibition band becomes steeper and the bandwidth of the pass band becomes narrower.

<Basic Band Pass Filter Bmsn (Where m, n are Variables, n is a Natural Number)>

Filter coefficients of a basic band pass filter Bmsn can be obtained through a moving average calculation by sequentially subtracting second preceding data from original data by taking numerical string "1, 0, m, 0, 1" as a starting point.

Figure 16:
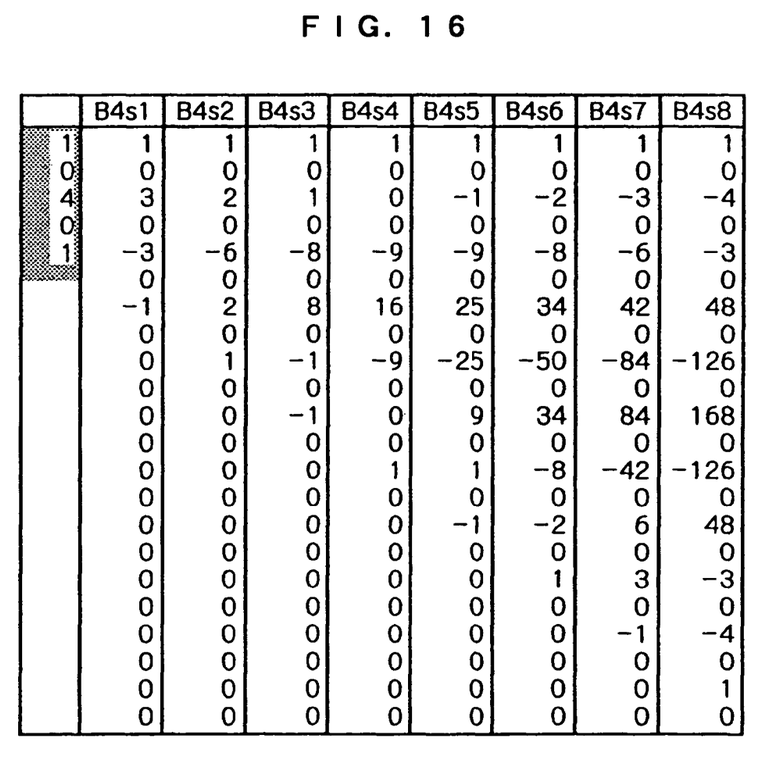
FIG. 16 illustrates filter coefficients of a basic band pass filter B4sn.

FIG. 16 illustrates filter coefficients of a basic band pass filter B4$sn$ (when m=4). In FIG. 16, in obtaining the jth filter coefficient from top of the nth column through a moving average calculation, the "original data" refers to the jth data from top of the (n−1)th column. Furthermore, the "preceding data" refers to the (j−2)th data from top of the (n−1)th column.

For example, the first numerical value "1" from top of a basic band pass filter B4$s1$ is obtained by subtracting preceding data "0" from original data "1" and the third numerical value "3" is obtained by subtracting preceding data "1" from original data "4." Furthermore, the fifth numerical value "−3" is obtained by subtracting preceding data "4" from original data "1" and the seventh numerical value "−1" is obtained by subtracting preceding data "1" from original data "0."

In a basic band pass filter B4$sn$ shown in FIG. 16, when n is an even number, filter coefficients of any numerical string are symmetric and are characterized in that the total values of every three values of the numerical string have opposite signs and the same value (for example, in the case of a basic band pass filter B4$s4$, 1+(−9)+(−9)+1=−16, 0+16+0=16). When n is an odd number, the absolute values of the numerical string are symmetric and the first half numerical string and the second half numerical string have opposite signs. Furthermore, the filter coefficients are characterized in that the total values of every three values of the numerical string have the opposite signs and the same value.

The above described numerical string "1, 0, m, 0, 1" is generated based on the basic numerical string "1, 0, N." The basic unit filter using this numerical string "1, 0, N" as filter coefficients has 1 to 2 taps (1 tap when N=0, otherwise 2 taps). Here, the value of N need not always be an integer.

Since the basic unit filter having this numerical string "1, 0, N" as filter coefficients is asymmetric, changing it to a symmetric type requires a plurality of basic unit filters to be cascade connected for use. For example, when two basic unit filters are cascade connected, the filter coefficients become "N, 0, N²+1, 0, N" as a result of a convolution of the numerical string "1, 0, N." Here, assuming that $(N^2+1)/N=m$, where m is an integer, $N=(m+(m^2-4)^{1/2})/2$.

When m=4 as shown in the example of FIG. 16, $N=2+\sqrt{3}$. That is, the coefficients of the basic unit filter become "1, 0, 3.732" (here, up to three decimal places are shown). Furthermore, the filter coefficients when two basic unit filters are cascade connected become "3.732, 0, 14.928, 0, 3.732." This numerical string has a relationship of 1:0:4:0:1.

When this numerical string is actually used as filter coefficients, each value of the numerical string is divided by 2N ($=2*(2+\sqrt{3})=7.464$) so that the amplitude when the numerical string of the filter coefficients is subjected to an FFT transform becomes "1" and the gain is normalized to "1." That is, the numerical string of the filter coefficients to be actually used becomes "½, 0, 2, 0, ½." This numerical string to be actually used "½, 0, 2, 0, ½" also corresponds to the original numerical string "1, 0, 4, 0, 1" multiplied by x times (x=1/(m−2)).

When the numerical string normalized as shown above is used as the filter coefficients, the filter coefficients of the basic band pass filter Bmsn are characterized in that the sum total of the numerical string is "0" and the total values of every three values of the numerical string have the opposite signs and the same value.

Here, the illustration of the hardware structure of the basic band pass filter Bmsn will be omitted, but it is constructed in the same way as in FIG. 12. That is, the basic band pass filter Bmsn is constructed of an FIR calculation section having a numeric string "½, 0, 2, 0, ½" which corresponds to the starting point as filter coefficients and a moving average calculation section that applies a moving average calculation to this numeric string. In the hardware structure of this basic band pass filter Bmsn, it is only the FIR calculation section in the first stage that requires the output taps and there are only a small number of taps. Furthermore, no multiplier is required.

The illustration of the frequency characteristic of the basic band pass filter Bmsn will also be omitted, but as in the case of the basic low pass filter Lman and basic high pass filter Hmsn, it shows a frequency-gain characteristic having a substantially flat pass band and an inhibition band with a gentle inclination. Furthermore, a rectilinear characteristic can be obtained as the frequency-phase characteristic. That is, it is possible to obtain a band pass filter having a good frequency characteristic with no overshoot or ringing. Here, when the value of n is increased, the inclination of the inhibition band becomes steeper and the bandwidth of the pass band becomes narrower. Furthermore, when the value of m is decreased, the inclination of the inhibition band becomes steeper and the bandwidth of the pass band becomes narrower.

When impulse responses of the above described three types of basic filters Lman, Hmsn, Bmsn are obtained, they form a function showing finite values other than "0" only when the sample position along the time axis is within a certain range with all values being "0" in other areas, that is, a function whose value converges to "0" at a predetermined sample position. Thus, the case where values of a function are finite values other than "0" in local areas and "0" in other areas is called "finite-base."

In such a finite-base impulse response, only data in a local area having a finite value other than "0" has a meaning. It is not the case that this data outside the area which originally should be considered is ignored but the data need not be considered theoretically, and therefore no discretization error occurs. Therefore, if the above described three types of basic filters Lman, Hmsn, Bmsn are used, it is not necessary to discard coefficients through windowing using a window function and it is possible to obtain a good filter characteristic.

As described in detail above, this embodiment designs a filter by cascading an original filter having a filter coefficient of a symmetric numeric string and an adjustment filter having a contact point at a position where the maximum value is acquired in the original filter frequency-amplitude characteristic and has a symmetric second filter coefficient realizing the frequency-amplitude characteristic having the minimum value at the contact point, and can thereby easily design an FIR digital filter having an ideal frequency characteristic with a relatively wide pass bandwidth and an inhibition band having a steep inclination without using any window function or approximate expression.

In addition, the above described embodiment has merely explained examples of implementation of the present invention and the technological scope of the present invention should not be interpreted limited to the embodiment. That is, the present invention can be implemented in various forms without departing from the spirit of the present invention or major features thereof.

INDUSTRIAL APPLICABILITY

The present invention is suitable for use in a type of an FIR digital filter provided with a tapped delay line made up of a plurality of delayers, wherein output signals of the respective taps are multiplied several-fold by filter coefficients respectively and their multiplication results are added up and output.

What is claimed is:

1. A method of providing filter coefficients for a digital filter, comprising:
   a first step of generating a first filter coefficient of a symmetric numeric string;
   a second step of obtaining a second filter coefficient of the symmetric numeric ring by realizing a second frequency-amplitude characteristic having a contact point at a position where a maximum value is acquired in a first frequency-amplitude characteristic expressed by said first filter coefficient and having a minimum value at said contact point; and
   a third step of executing a calculation to obtain a third filter coefficient of the symmetric numeric ring obtained when a first filter having said first filter coefficient and a second filter having said second filter coefficient are cascaded,
   wherein said third filter coefficient generated in said third step is determined as the filter coefficient to be obtained, and
   wherein, said digital filter multiplies the plurality of filter coefficients with signals at taps of a tapped delay line made up of a plurality of delayers, sums up the multiplication results and outputs the sum.

2. A digital filter which multiplies signals at taps of a tapped delay line made up of a plurality of delayers by given filter coefficients, sums up the multiplication results and outputs the sum,
   setting said third filter coefficient determined using the method according to claim 1 to provide the filter coefficients for signals of said respective taps.

3. The method according to claim 1, wherein the symmetric numeric string is output when a single pulse is input to said first filter and is expressed by $\{H_m, H_{m-1}, \ldots, H_1, H_0, H_{-1}, \ldots, H_{-(m-1)}, H_{-m}\}$, and said second filter coefficient in said second step is obtained through a calculation $\{-kH_m, -kH_{m-1}, \ldots, -kH_1, -kH_0+(1+k), -kH_{-1}, \ldots, -kH_{-(m-1)}, -kH_{-m}\}$, and wherein k is an arbitrary positive number.

4. The method according to claim 3, wherein using said third filter coefficient generated in said third step as said first filter coefficient, the processes in said second step and said third step are repeated two or more times, and
   said second filter coefficient is obtained, assuming k≠1, in said second step in a middle stage of said repeated processes, said second filter coefficient is obtained, assuming k=1, in said second step which is a final stage and said third filter coefficient generated in said third step of the final stage is determined as the filter coefficient to be obtained.

5. The method according to claim 1, wherein
   using said third filter coefficient generated in said third step as said first filter coefficient, the processes in said second step and said third step are repeated two or more times to determine the filter coefficient generated in said third step which is the final stage as the filter coefficient to be obtained.

6. The method according to claim 1, wherein an x-bit (x<y) filter coefficient is obtained by applying rounding of discarding several lower bits to the y-bit data of said third filter coefficient.

7. The method according to claim 6, wherein the x-bit filter coefficients are subjected to second rounding of multiplying $2^x$-fold said x-bit filter coefficients and rounding the decimal fractions so as to round the filter coefficients to an integer.

8. A digital filter design device comprising:
   filter coefficient storage means for storing data of a first filter coefficient of a symmetric numeric string; and
   calculation means for executing:
      a calculation to obtain a second filter coefficient of a symmetric numeric string by realizing a second frequency-amplitude characteristic having a contact point at a position where a maximum value is acquired in a first frequency-amplitude characteristic expressed by said first filter coefficient and having a minimum value at said contact point; and
      a calculation to obtain a third filter coefficient obtained when a first filter having said first filter coefficient and a second filter having said second filter coefficient are cascaded,
   wherein data of said filter coefficients are stored in said filter coefficient storage means, and
   wherein said calculation means uses the data stored in said filter coefficient storage means.

9. A digital filter which multiplies signals at taps of a tapped delay line made up of a plurality of delayers by given filter coefficients, adds up the multiplication results and outputs the addition result, comprising:
   an original filter having a first filter coefficient of a symmetric numeric string; and
   an adjustment filter having a second filter coefficient of the symmetric string by realizing a frequency-amplitude characteristic having a contact point at a position where a maximum value is acquired in said original filter frequency-amplitude characteristic and having a minimum value at said contact point,
   wherein said original filter and said adjustment filter are cascaded.

10. The digital filter according to claim 9, wherein when the numerical string output from said original filter when a single pulse is input to said original filter is expressed by $\{H_m, H_{m-1}, \ldots, H_1, H_0, H_{-1}, \ldots, H_{-(m-1)}, H_{-m}\}$, said second filter coefficient making up said adjustment filter is $\{-kH_m, -kH_{m-1}, \ldots, -kH_1, -kH_0+(1+k), -kH_{-1}, \ldots, -kH_{-(m-1)}, -kH_{-m}\}$ (k is an arbitrary positive number).

11. A digital filter which multiplies signals at taps of a tapped delay line made up of a plurality of delayers by given filter coefficients, adds up the multiplication results and outputs the addition result, comprising:

an original filter having a first filter coefficient of a symmetric numeric string; and a plurality of adjustment filters having a second filter coefficient of a symmetric numeric string, cascaded in that order, wherein said second filter coefficients making up said plurality of adjustment filters are symmetric filter coefficients each realizing a frequency-amplitude characteristic having a contact point at a position where a maximum value is acquired in the frequency-amplitude characteristic specified by the numeric string output from an anterior filter when a single pulse is input to said original filter and having a minimum value at said contact point.

12. The digital filter according to claim 11, wherein when the numeric string output from said anterior filter is assumed to be $\{H_m, H_{m-1}, \ldots, H_1, H_0, H_{-1}, \ldots, H_{-(m-1)}, H_{-m}\}$, a second filter coefficient making up said adjustment filter is $\{-kH_m, -kH_{m-1}, \ldots, -kH_1, -kH_0+(1+k), -kH_{-1}, \ldots, -kH_{-(m-1)}, -kH_{-m}\}$ (k is an arbitrary positive number.

13. The digital filter according to claim 12, comprising said original filter, one or more said adjustment filters in which said second filter coefficients are set as $k \ne 1$ and one or more said adjustment filters in which said second filter coefficients are set as $k=1$, cascaded in that order.

14. A computer-readable storage medium encoded with instructions operable to cause a computer to implement a method of digital filter design, comprising:

generating a first filter coefficient of a symmetric numeric string;

obtaining a second filter coefficient of the symmetric numeric string by realizing a second frequency-amplitude characteristic having a contact point at a position where a maximum value is acquired in a first frequency-amplitude characteristic expressed by said first filter coefficient and having a minimum value at said contact point; and executing a calculation to obtain a third filter coefficient of the symmetric numeric string obtained when a first filter having said first filter coefficient and a second filter having said second filter coefficient are cascaded, wherein said third filter coefficient generated in the executing of the calculation is determined as the filter coefficient to be obtained.

15. The digital filter design method according to claim 14, wherein the symmetric numeric string is output when a single pulse is input to said first filter and is expressed by $\{H_m, H_{m-1}, \ldots, H_1, H_0, H_{-1}, \ldots, H_{-(m-1)}, H_{-m}\}$; and said second filter coefficient in said second step is obtained through a calculation $\{-kH_m, -kH_{m-1}, \ldots, -kH_1, -kH_0+(1+k), -kH_{-1}, \ldots, -kH_{-(m-1)}, -kH_{-m}\}$, wherein k is an arbitrary positive number.

16. The digital filter design method according to claim 15, wherein using said third filter coefficient generated in said third step as said first filter coefficient, the processes in said second step and said third step are repeated two or more times, and said second filter coefficient is obtained assuming $k \ne 1$ in said second step in a middle stage of said repeated processes, said second filter coefficient is obtained assuming $k=1$ in said second step which is the final stage and said third filter coefficient generated in said third step of the final stage is determined as the filter coefficient to be obtained.

17. The digital filter design method according to claim 14, wherein using said third filter coefficient generated in said third step as said first filter coefficient, the processes in said second step and said third step are repeated two or more times to determine the filter coefficient generated in said third step which is the final stage as the filter coefficient to be obtained.

18. The digital filter design method according to claim 14, wherein an x-bit (x<y) filter coefficient is obtained by applying rounding of discarding several lower bits to the y-bit data of said third filter coefficient.

19. The digital filter design method according to claim 18, wherein the x-bit filter coefficients are subjected to second rounding of multiplying $2^x$-fold said x-bit filter coefficients and rounding the decimal fractions so as to round the filter coefficients to an integer.

* * * * *